(12) United States Patent
Ishida et al.

(10) Patent No.: US 6,506,640 B1
(45) Date of Patent: Jan. 14, 2003

(54) MULTIPLE CHANNEL IMPLANTATION TO FORM RETROGRADE CHANNEL PROFILE AND TO ENGINEER THRESHOLD VOLTAGE AND SUB-SURFACE PUNCH-THROUGH

(75) Inventors: Emi Ishida, Sunnyvale, CA (US); Deepak K. Nayak, Fremont, CA (US); Ming Yin Hao, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,686

(22) Filed: Sep. 22, 2000

Related U.S. Application Data

(60) Provisional application No. 60/155,551, filed on Sep. 24, 1999.

(51) Int. Cl.[7] ..................... H01L 21/8238; H01L 21/336
(52) U.S. Cl. .................. 438/217; 257/289; 257/282
(58) Field of Search .................. 438/289, 305, 438/275, 276, 217, 514, 282, 526, 279, 530, 299

(56) References Cited

U.S. PATENT DOCUMENTS 6,245,618 B1 * 6/2001 An et al. .................... 438/289
6,245,649 B1 * 6/2001 Buller et al. ................ 438/514
6,312,981 B1 * 11/2001 Akamatsu et al. .......... 438/217

* cited by examiner

*Primary Examiner*—Phat X. Cao
*Assistant Examiner*—Hoa B. Trinh

(57) ABSTRACT

Submicron-dimensioned, MOSFET devices are formed using multiple implants for forming an impurity concentration distribution profile exhibiting three impurity concentration peaks at a predetermined depths below the semiconductor surface substrate. The inventive method reduces "latch-up" and "punch-through" with controllable adjustment of the threshold voltage.

5 Claims, 2 Drawing Sheets

MULTIPLE CHANNEL IMPLANTATION TO FORM RETROGRADE CHANNEL PROFILE AND TO ENGINEER THRESHOLD VOLTAGE AND SUB-SURFACE PUNCH-THROUGH

This application claims priority from U.S. Provisional Application Ser. No. 60/155,551, filed Sep. 24, 1999, incorporated herein by reference.

FIELD OF THE INVENTION

The present invention relates to a method of manufacturing semiconductor devices. The invention has particular applicability in manufacturing high-density metal oxide semiconductor field effect transistors (MOSFETs) with sub-micron design features.

BACKGROUND ART

The escalating requirements for high density and performance associated with ultra large scale integration (ULSI) semiconductor devices require design features of 0.18 μm and below, such as 0.15 μm and below, increased transistor and circuit speeds, high reliability, and increased manufacturing throughput for economic competitiveness. The reduction of design features to 0.18 μm and below challenges the limitation of conventional semiconductor manufacturing techniques.

The principle elements of a typical MOSFET device generally comprise a semiconductor substrate on which a gate electrode is disposed. The gate electrode is typically a heavily doped conductor and a gate input signal is applied to the gate electrode via a gate terminal. Heavily doped source and drain regions are formed in the semiconductor substrate and are connected to source and drain terminals. A channel region is formed in the semiconductor substrate below the gate electrode and separates the source and drain regions. The gate electrode is separated from the semiconductor substrate by a gate oxide layer to prevent current from flowing between the gate and the source and drain regions or the channel region.

In operation, an output voltage is typically developed between the source and drain terminals. When an input voltage is applied to the gate electrode, a transverse electrical field is set up in the channel region. By varying the transverse electric field between the source and drain regions, it is possible to modulate the conductance of the channel region between the source and drain regions. In this manner, an electric field controls the current flow through the channel region. The channel is typically lightly doped with an impurity type opposite to that of the source/drain regions, and the impurity concentration profile is typically uniform from the surface toward the direction of depth, as shown by line 10 in FIG. 1.

Such an MOS structure is however susceptible to a "latch up" phenomenon which establishes very low resistance path between $V_{DD}$ and $V_{SS}$ power lines, allowing excessive current to flow across power supply terminals. The susceptibility to "latch up" arises from the presence of complementary parasitic bipolar transistor structures, which result from the fabrication of complementary MOS (CMOS) devices. Since they are in close proximity to one another, the complementary bipolar structures can interact electrically to form device structures which behave like a pnpn diode. In the absence of triggering currents, such diodes act as reverse-biased junctions and do not conduct. However, it is possible for triggering currents to be established in a variety of ways during abnormal circuit operation conditions. Since there are many such parasitic pnpn structures on a single chip, it is possible to trigger any one of them into "latch up" and cause the device to cease functioning or even destroy the device itself due to heat damage caused by high power dissipation.

Many approaches have been introduced, such as a retrograde well structure, to control or even eliminate "latch up". As shown by curve 12 in FIG. 1, the retrograde well structure normally has an impurity concentration peak located deep under the surface of a silicon substrate. Such a retrograde well structure has been preferably formed by ion implanting impurity atoms (i.e., boron for an NMOS device) under predetermined conditions, for example, implantation concentration, energy, and duration, so as to form a predetermined impurity concentration peak value at a predetermined depth 1 below the top surface of the substrate. However, formation of a P type retrograde channel by ion implanting boron is problematic, principally due to the ease with which boron atoms diffuse in silicon substrates. The rapidity of boron atom diffusion upon thermal treatment for post-implantation activation/lattice damage relaxation disadvantageously results in a relatively flat concentration profile, as shown by curve 14 in FIG. 1.

Thus, a need exists for improved semiconductor manufacturing methodology for fabricating MOSFET devices which do not suffer from the above-described drawback associated with the rapid diffusion of boron atoms in silicon substrates. Moreover, there exists a need for an improved process for fabricating MOS transistors with reduced short-channel effects, such as, "punch-through", which process is fully compatible with conventional process flow and provides increased manufacturing throughput and product yield.

DISCLOSURE OF THE INVENTION

An advantage of the present invention is a simplified, efficient, and production worthy method for manufacturing a semiconductor device which is less susceptible to "latch-up" and "punch-through" effects.

According to the present invention, the foregoing and other advantages are achieved in part by a method of manufacturing a semiconductor device, the method comprising: ion implanting, a first impurity of a first conductive type into a semiconductor substrate to form a sharp retrograde impurity region having a first impurity concentration peak formed at a first depth below the top surface of the semiconductor substrate; and ion implanting a second impurity of the first conductive type into the semiconductor substrate to form a shallow impurity region having a second impurity concentration peak at a second depth below the top surface, the second depth less than the first depth.

Another aspect of the present invention is a semiconductor device comprising: a semiconductor substrate having a top surface; a retrograde impurity region containing a first impurity of a first conductive type, having a first impurity concentration peak at a first depth below the top surface; and a shallow impurity region containing a second impurity of the first conductive type, having a second impurity concentration peak at a second depth below the top surface, the second depth less than the first depth.

Additional advantages of the present invention will become readily apparent to those skilled in the art from the following detailed description, wherein only the preferred embodiment of the present invention is shown and described, simply by way of illustrating the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature and not restrictive.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF THE DRAWINGS

Figure 1:
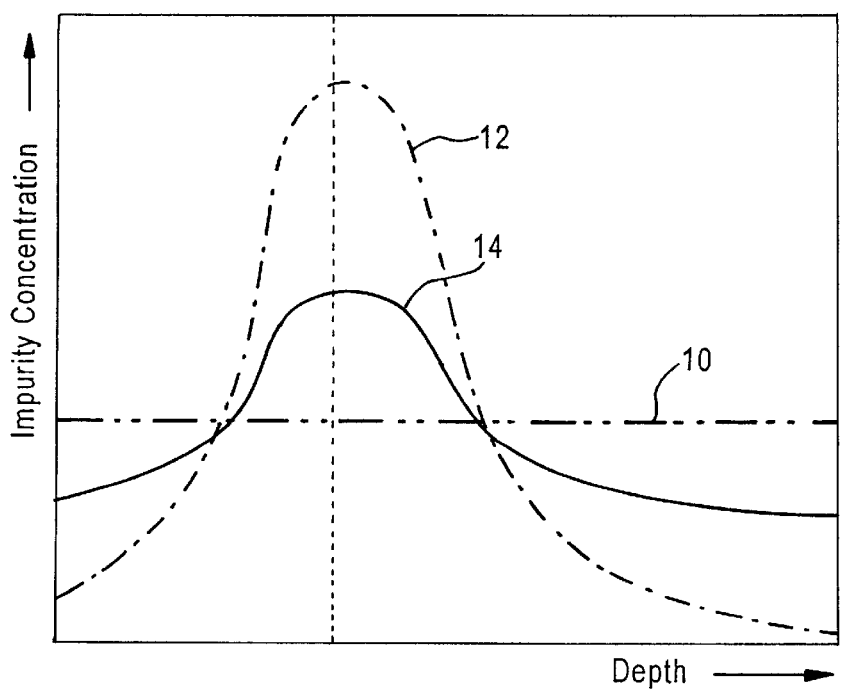
FIG. 1 depicts the impurity concentration profile of prior art channel regions that are formed by ion implantation and subsequent thermal treatment processes.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-section portions of an integrated circuit device during fabrication are not drawn to scale, but instead are drawn to illustrate certain features of the present invention.

According to the present invention, methods are provided that solve the problems arising from manufacturing submicron dimensioned MOSFET devices suitable for use in high-density integration semiconductor devices, wherein, as part of the fabrication methodology, low-diffusivity atoms are ion implanted into semiconductor substrates.

More specifically, the present invention advantageously provides a significant improvement in the tailoring of the impurity concentration distribution profile of the channel regions, thereby minimizing or substantially avoiding "latch-up" problems which generally arise from the unavoidable formation of pnpn diode structures during conventional CMOS processing and "short channel" effects such as "punch through" which arise from the widening of the drain depletion region due to the low channel impurity concentration.

The inventive method thus increases device reliability and manufacturing throughput, while maintaining high channel mobility. In addition, the method of the present invention is fully compatible with other aspects of existing process methodology.

In accordance with certain embodiments of the present invention, a method of manufacturing MOS and CMOS devices is provided which utilizes multiple implantation processing steps: a low diffusive impurity region having a substantially retrograde concentration distribution profile with an impurity concentration peak at a desired depth below a semiconductor surface to substantially avoid "latch-up"; a shallow impurity region extending from the semiconductor surface to a desired depth below the top surface of the substrate to controllably adjust the threshold voltage of the device; and an optional deep impurity region with an impurity concentration peak at a desired depth below the top surface of the substrate to substantially avoid "punch through".

As part of the present invention, it was recognized that formation of a retrograde impurity distribution profile in a channel region by ion implanting diffusive impurities (e.g., boron) is problematic because such impurities diffuse too much upon a subsequent annealing process which is necessarily required to repair the lattice damage from the previous ion implantation steps. As such, the rapidity boron atom diffusion upon the thermal treatment for the activation and lattice damage relaxation disadvantageously results in a relatively flat impurity distribution profile in a channel region.

Figure 2:
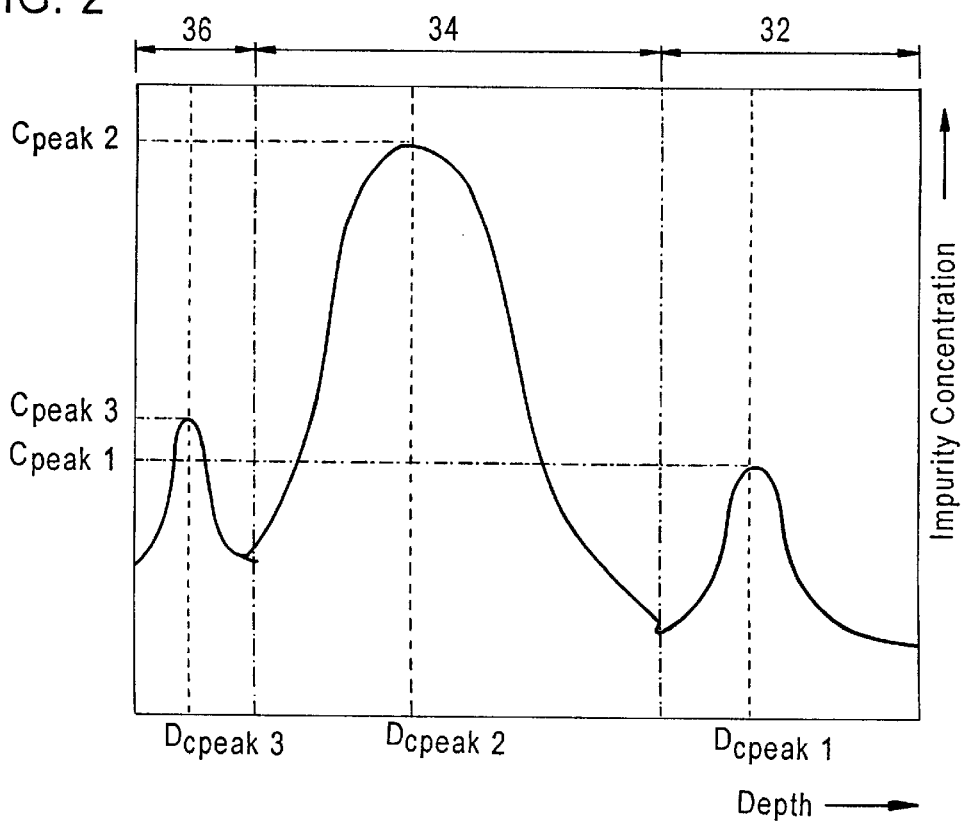
FIG. 2 depicts a channel impurity concentration profile in accordance with an embodiment of the present invention following first, second and third impurity implantation processes and a subsequent annealing process, in which a deep impurity region, a retrograde impurity region, and a shallow impurity region are respectively formed within the semiconductor substrate.
Figure 3A:
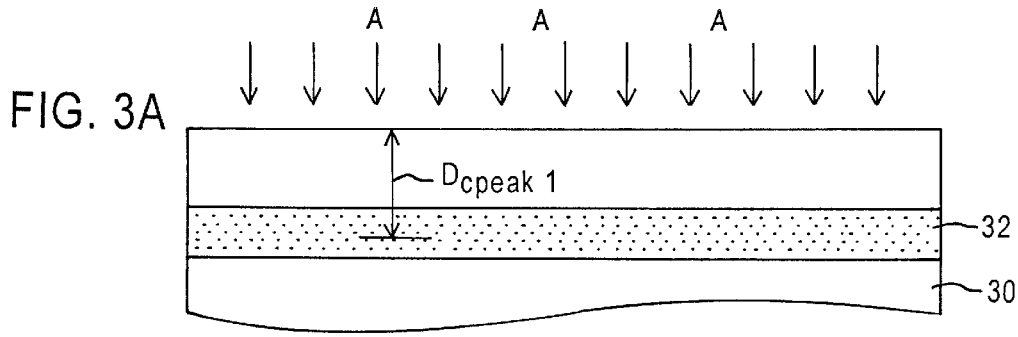
FIG. 3A depicts a cross section of a portion of a semiconductor wafer in accordance with the present invention during a first implantation process in which a deep impurity region is formed within a semiconductor substrate, with a first impurity concentration peak at a first depth below the top surface of the semiconductor substrate.

With this in mind, FIG. 3A depicts a cross-section of a portion of a semiconductor wafer, in accordance with an exemplary embodiment of the present invention. The portion comprises a semiconductor substrate 30, such as, for example, a lightly doped monocrystalline silicon. First conductive type impurity atoms, such as, for example, boron for an NMOS device, are ion implanted into the top surface of the substrate 30 under predetermined conditions, for example, implantation concentration, energy, and duration, so as to form the deep impurity region 32 having a predetermined impurity concentration peak value $C_{peak}1$ at a predetermined depth $D_{Cpeak}1$ below the top surface of the substrate 30. As shown in FIG. 2, according to the practice of the present invention, $C_{peak}1$ and $D_{Cpeak}1$ are predetermined so as to substantially correspond to a desired, respective concentration level and peak depth value of the deep impurity implant 32 to be formed in the semiconductor for substantially reducing the leakage current by "punch-through".

Given the guidance of the present disclosure and disclosed objectives, the optimum implantation parameters can be determined in a particular situation. For example, boron atoms can be ion implanted into a monocrystalline silicon substrate at an implantation concentration of between about $1 \times 10^{12}$ atoms $cm^{-2}$ to about $1 \times 10^{14}$ atoms $cm^{-2}$ and at an implantation energy of between about 50 KeV to about 150 KeV.

Figure 3B:
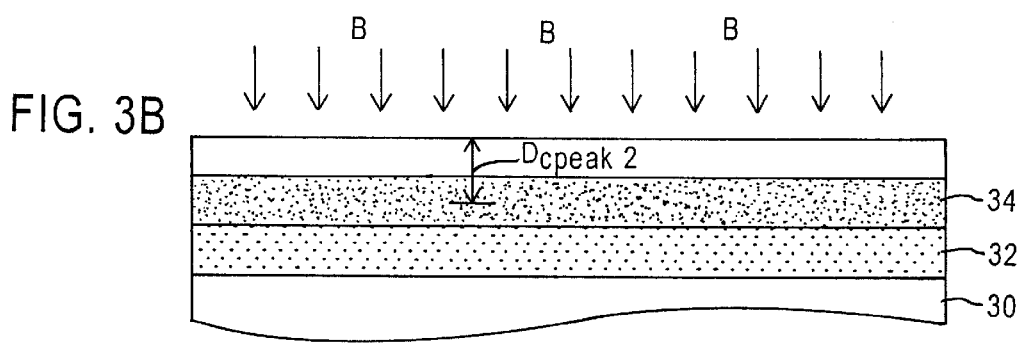
FIG. 3B depicts a cross section of the portion of FIG. 1A during a second implantation process in which a retrograde impurity region is formed within the semiconductor substrate, with a second impurity concentration peak at a second depth below the top surface of the semiconductor substrate.

FIG. 3B depicts the portion that is subject to a second implantation process in which a low-diffusivity impurity (i.e., indium for an NMOS device, or arsenic and antimony for an PMOS device) is ion implanted to form the retrograde impurity region 34 under the condition of providing an approximately parabolically-shaped impurity concentration distribution profile, as shown in FIG. 2, above the deep impurity region 32. Implantation is performed under conditions, such as, for example, implantation concentration, energy, and duration for implanting a sufficient amount of the low-diffusivity atoms so as to form a retrograde impurity region 34 having a predetermined impurity concentration peak value $C_{peak}2$ at a predetermined depth $Dc_{peak}2$ below the surface of the semiconductor substrate. According to the practice of the present invention, $C_{peak}2$ and $Dc_{peak}2$ are predetermined so as to substantially correspond to a desired, respective concentration level and peak depth value of the retrograde impurity region 34 to be formed in the semiconductor for substantially avoiding "latch-up".

Given the guidance of the present disclosure and disclosed objectives, the optimum implantation parameters can be determined in a particular situation. For example, indium atoms can be ion implanted into a monocrystalline silicon substrate at an implantation concentration of between about between about $1 \times 10^{12}$ atoms $cm^{-2}$ to about $1 \times 10^{14}$ atoms $cm^{-2}$ and at an implantation energy of between about 60 KeV to about 280 KeV.

Although in the illustration of FIG. 2, the parabolically-shaped concentration profile of the retrograde impurity region 34 is shown, this exact shape is not critical for practice of the present invention. Accordingly, the retrograde impurity region 34 may have a substantially flat or a super-steep concentration distribution profile.

Figure 3C:
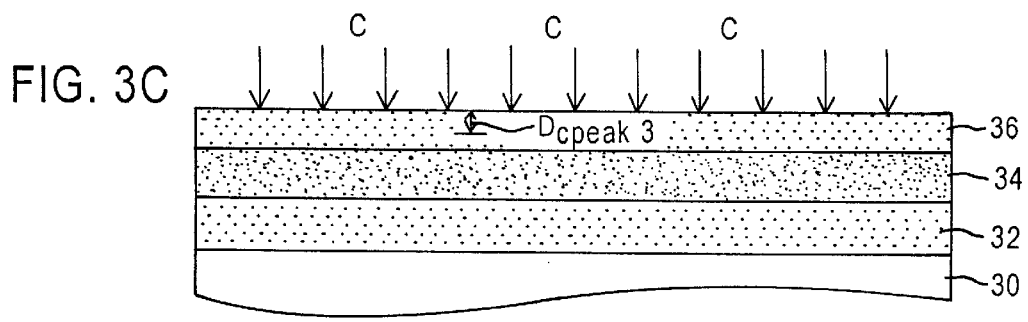
FIG. 3C depicts a cross section of the portion of FIG. 1B during a third implantation process in which a shallow impurity region is formed within the semiconductor substrate, with a third impurity concentration peak at a third depth below the top surface of the semiconductor substrate.

FIG. 3C depicts the portion that is now subject to a third implantation process in which an impurity is ion implanted under predetermined conditions to form the shallow impurity region 36 having a predetermined impurity concentration peak $C_{peak}3$ at a predetermined depth $D_{Cpeak}3$ below the surface of the semiconductor substrate. According to the practice of the present invention, $C_{peak}3$ and $D_{Cpeak}3$ are predetermined so as to substantially correspond to a desired, respective concentration and peak depth value of the shallow impurity region 36 of the first conductive type to be formed in the semiconductor to controllably adjust the threshold voltage of the semiconductor devices to be formed subsequently therein.

Given the guidance and objectives of the present disclosure, the optimum implantation conditions can be determined in a particular situation. For example, boron atoms can be ion implanted into a monocrystalline silicon substrate at an implantation concentration of between about $1 \times 10^{12}$ atoms $cm^{-2}$ to about $1 \times 10^{14}$ atoms $cm^2$ and at an implantation energy of between about 60 KeV to about 280 KeV.

Figure 3D:
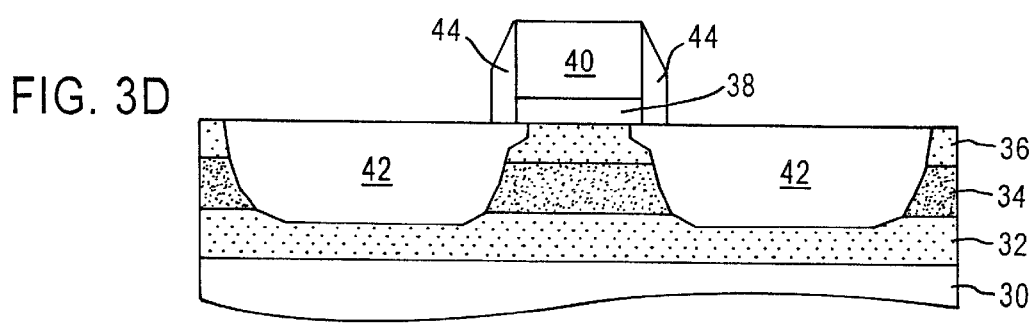
FIG. 3D depicts a cross section of the portion of FIG. 1C following a subsequent annealing process and an exemplary MOSFET device formation process in which source and drain regions of the MOSFET device are formed within the semiconductor substrate, extending from the shallow impurity region to the deep impurity region through the retrograde impurity region.

Referring now to FIG. 3D, shown therein is an exemplary structural embodiment of the present invention, in which a gate electrode 40 is formed on the substrate 30, which is electrically isolated by a gate oxide layer 38 is formed therebetween. Sidewall spacers 44 are formed on side surfaces of the gate electrode 40 and gate oxide 38. Source and drain regions 42 are formed, extending from the surface of the substrate 30 to the deep impurity region 32 through the shallow impurity region 36 and retrograde impurity region 34.

The present invention thus enables rapid, reliable formation of improved submicron dimensioned MOSFET devices at increased rates of manufacturing throughput, by utilizing a relatively simple multiple implantation process for achieving desired channel impurity distribution profiles at a desired depths to avoid or at least minimize "latch-up" and "punch-through" and to controllably adjust the threshold voltage.

Finally, the present invention is applicable to the formation of other types of transistors and devices and is fully compatible with conventional process flow for automated manufacture of highdensity integration semiconductor devices.

In the previous description, numerous specific details are set forth, such as specific materials, structures, processes, etc. in order to provide a better understanding of the present invention. However, the present invention can be practices without resorting to the details specifically set forth. In other instances, well-known processing materials and techniques have been described in detail in order not to unnecessary obscure the present invention.

Only the preferred embodiment of the present invention and but a few examples of its versatility are shown and described in the present disclosure. It is to be understood that the present invention is capable of use in various other combinations and environments and is susceptible of changes or modification within the scope of the inventive concept as expressed herein.

What is claimed is:

1. A method for manufacturing a semiconductor device comprising:

ion implanting a first impurity of a first conductive type into a semiconductor substrate to form a retrograde impurity region having a first impurity concentration peak formed at a first depth below the top surface of the semiconductor substrate;

ion implanting a second impurity of the first conductive type into the semiconductor substrate to form a shallow impurity region having a second impurity concentration peak at a second depth below the top surface, the second depth less than the first depth and the second impurity being different than the first impurity;

further comprising ion implanting a third impurity of the first conductive type into the semiconductor substrate to form a deep impurity region having a third impurity concentration peak at a third depth below the top surface of the semiconductor substrate, the third depth greater than the first depth; and wherein the second and third impurities are boron and the first impurity is indium.

2. The method according to claim 1, wherein the step of ion implanting the first impurity includes ion implanting the first impurity at an implantation concentration of between about $1 \times 10^{12}$ atoms $cm^{-2}$ to about $1 \times 10^{14}$ atoms $cm^{-2}$ and at an implantation energy of between about 60 KeV to about 280 KeV.

3. The method according to claim 1, wherein the step of ion implanting the second impurity includes ion implanting the second impurity at an implantation concentration of between about $1 \times 10^{12}$ atoms $cm^{-2}$ to about $1 \times 10^-$ atoms $cm^{-2}$ and at an implantation energy of between about 5 KeV to about 80 KeV.

4. The method according to claim 1, wherein the step of ion implanting the third impurity includes ion implanting the third impurity at an implantation concentration of between about $1 \times 10^{12}$ atoms $cm^{-2}$ to about $1 \times 10^{14}$ atoms $cm^{-2}$ and at an implantation energy of between about 50 KeV to about 150 KeV.

5. A method for manufacturing a semiconductor device comprising:

ion implanting a first impurity of a first conductive type into a semiconductor substrate to form a retrograde impurity region having a first impurity concentration peak formed at a first depth below the top surface of the semiconductor substrate;

ion implanting a second impurity of the first conductive type into the semiconductor substrate to form a shallow impurity region having a second impurity concentration peak at a second depth below the top surface, the second depth less than the first depth and the second impurity being different than the first impurity;

further comprising ion implanting a third impurity of the first conductive type into the semiconductor substrate to form a deep impurity region having a third impurity concentration peak at a third depth below the top surface of the semiconductor substrate, the third depth greater than the first depth; and wherein the second and third impurities are phosphorus and the first is impurity is at least one of arsenic or antimony.

* * * * *

UNITED STATES PATENT AND TRADEMARK OFFICE
CERTIFICATE OF CORRECTION

PATENT NO. : 6,506,640 B1
DATED : January 14, 2003
INVENTOR(S) : Emi Ishida et al.

It is certified that error appears in the above-identified patent and that said Letters Patent is hereby corrected as shown below:

Column 6,
Line 57, change "1x10" to -- $1x10^{14}$ --

Signed and Sealed this

Twenty-second Day of April, 2003

JAMES E. ROGAN
*Director of the United States Patent and Trademark Office*